United States Patent [19]

Norris et al.

[11] Patent Number: 5,556,665
[45] Date of Patent: Sep. 17, 1996

[54] MENISCUS COATING OF CRT SCREENS

[75] Inventors: Roland W. Norris, Hanover Park; Hua-Sou Tong, Arlington Heights, both of Ill.

[73] Assignee: Zenith Electronics Corporation, Glenview, Ill.

[21] Appl. No.: 970,906

[22] Filed: Nov. 3, 1992

[51] Int. Cl.[6] .................................................. B05D 5/06
[52] U.S. Cl. .......................... 427/64; 118/401; 427/286; 427/157
[58] Field of Search .................... 427/157, 64, 68, 427/286; 118/401, 669, 264, 679, 223, 255, 216

[56] References Cited

U.S. PATENT DOCUMENTS

| | | | |
|---|---|---|---|
| 2,543,013 | 2/1951 | Glassey | 118/401 |
| 2,543,045 | 2/1951 | Murray | 118/401 |
| 2,916,012 | 12/1959 | Hergenrother | 118/315 |
| 3,367,791 | 2/1968 | Lein | 118/401 |
| 3,756,196 | 9/1973 | Furuuchi et al. | 118/401 |
| 3,810,779 | 5/1974 | Pickett et al. | 118/401 |
| 3,876,465 | 4/1975 | Prazak, III | 117/33.5 C |
| 4,004,045 | 1/1977 | Stelter | 427/55 |
| 4,154,193 | 5/1979 | Moriguchi et al. | 118/230 |
| 4,370,356 | 1/1983 | Bok et al. | 427/38 |
| 5,336,575 | 8/1994 | Tong | 427/158 |

*Primary Examiner*—Brenda A. Lamb

[57] ABSTRACT

An apparatus and method for forming color video display screens of the line or stripe screen type are disclosed. Tubules form menisci of screen element liquids which are contacted with a moving display screen surface to produce screen element lines comprising the screen.

16 Claims, 3 Drawing Sheets

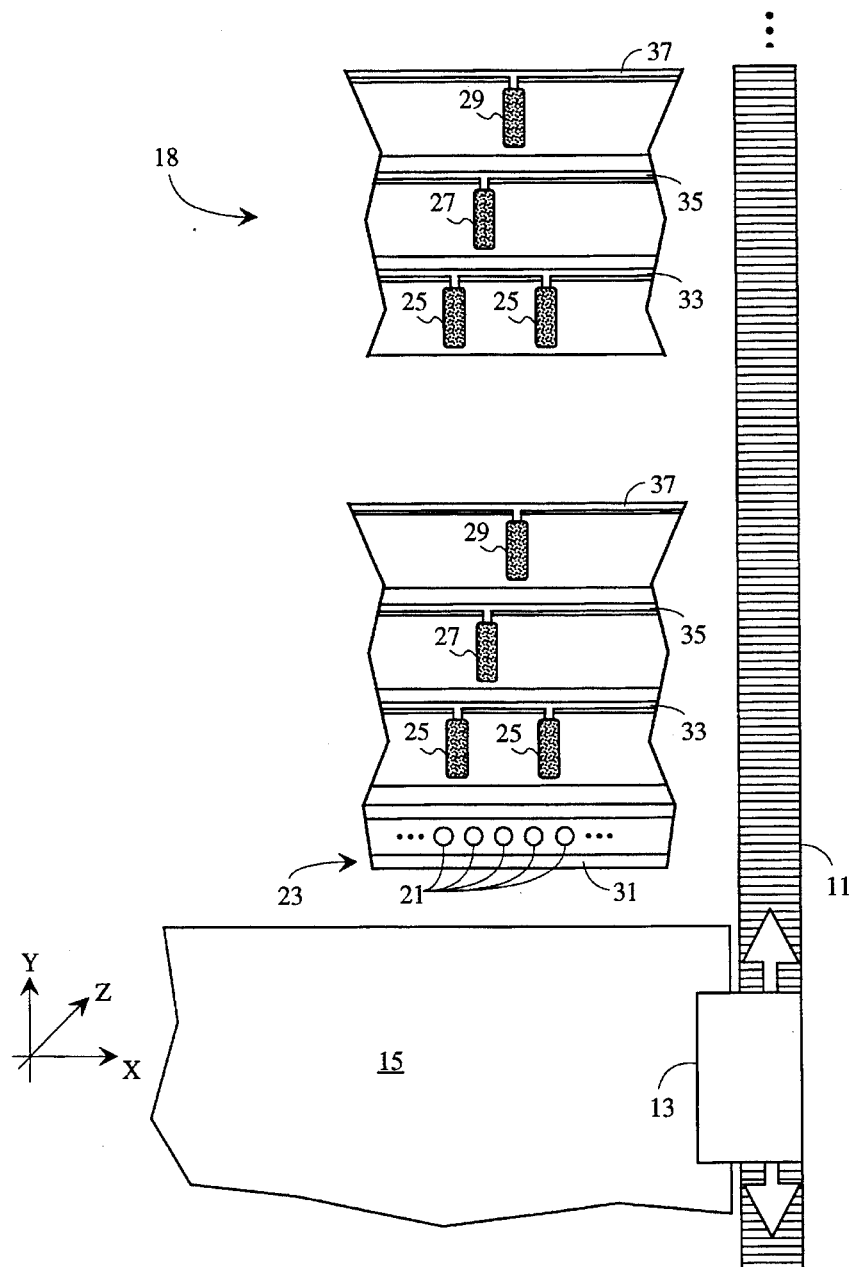
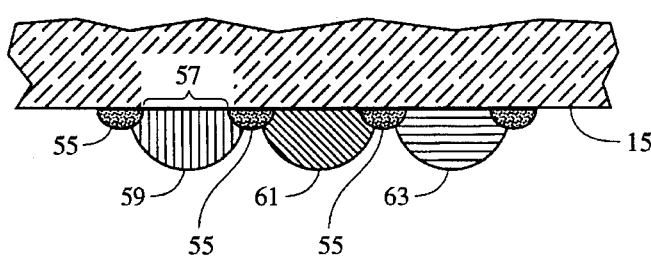
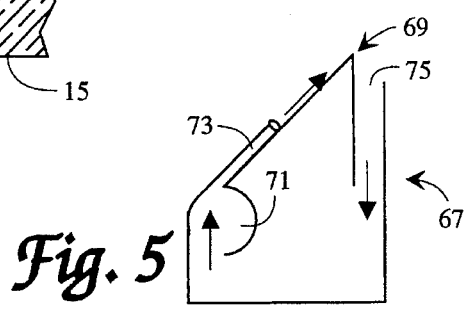
Fig. 3
Fig. 4
Fig. 5

MENISCUS COATING OF CRT SCREENS

BACKGROUND OF THE INVENTION

1. Field of the Invention

The present invention relates generally to the meniscus coat printing of stripe or line screens for luminescent video displays, such as may be found, for example, on color cathode ray tubes (CRTs).

2. Discussion of the Related Art

In the art of CRT screen application there are known many forms of screen deposition. Among these are the well known photolithographic techniques for color screens wherein photosensitive slurries containing the luminescent phosphors are spin coated to the faceplates and exposed to light wavelengths actinic to the photosensitive slurry, whereupon the exposed pattern of slurry is washed and baked. In color CRT screens serial light exposures are made to form each of the grille, or black matrix, pattern and red, green and blue phosphor patterns hereinafter generically referred to as "screen elements". Spin coating can result in slurry waste, skirt or mask support contamination, and uneven coating thickness. Photolithographic exposure takes numerous time consuming steps.

So called "silk screen" printing is also utilized wherein a phosphor containing paste, is squeegeed through a wire form to print the screen. Multiple passes for each phosphor and grille element of the color CRT screen must also be made. The wire form can be subject to distortion when the squeegee presses the paste there through thereby causing a distortion of the screen pattern.

Printing of the direct contact, or offset, type has also been proposed. Registration and repeatability of the screen elements is considered somewhat problematical for the alignment of each phosphor and grille element in single or multiple pass applications due to the distortion of the print blanket media owing to the pressure of contact on the glass faceplate. Further, the substrate must be very uniform to accept a complete transfer of phosphor inks from the print blanket.

Therefore, it will be seen that of the prior art methods discussed, all have drawbacks in relation to either the amount of processing steps, the waste of materials, or registration and alignment from the multiplicity of screen element applications needed with a deformable apparatus. All known CRT screening processes have drawbacks with regard to screen pattern distortion or excess time and material expenditure.

As per the above discussion, there exists a desiderata in the display industry for a reliable, high quality, pressure free, one pass application, with a minimum of material waste in the production of CRT phosphor screens.

It is therefore among the objects of the present invention to provide such a system for the production of CRT line screens without the use of multiple exposure photolithographic techniques or printing with apparatus which may distort under the pressures of printing. It is further among the objects of the present invention to provide for phosphor screen production with a minimum waste of the screen materials.

BRIEF DESCRIPTION OF THE DRAWINGS

Other attendant advantages will be more readily appreciated as the invention becomes better understood by reference to the following detailed description and compared in connection with the accompanying drawings in which like reference numerals designate like parts throughout the figures. It will be appreciated that the drawings may be exaggerated for explanatory purposes.

FIG. 3 is an alternative embodiment of FIG. 1 having a redundant array of meniscus tubules.

FIG. 4 illustrates in cross-section a portion of a CRT line screen produced according to the present invention.

FIG. 5 illustrates an alternative embodiment of a meniscus producing surface.

DESCRIPTION OF THE PREFERRED EMBODIMENT

Figure 1:
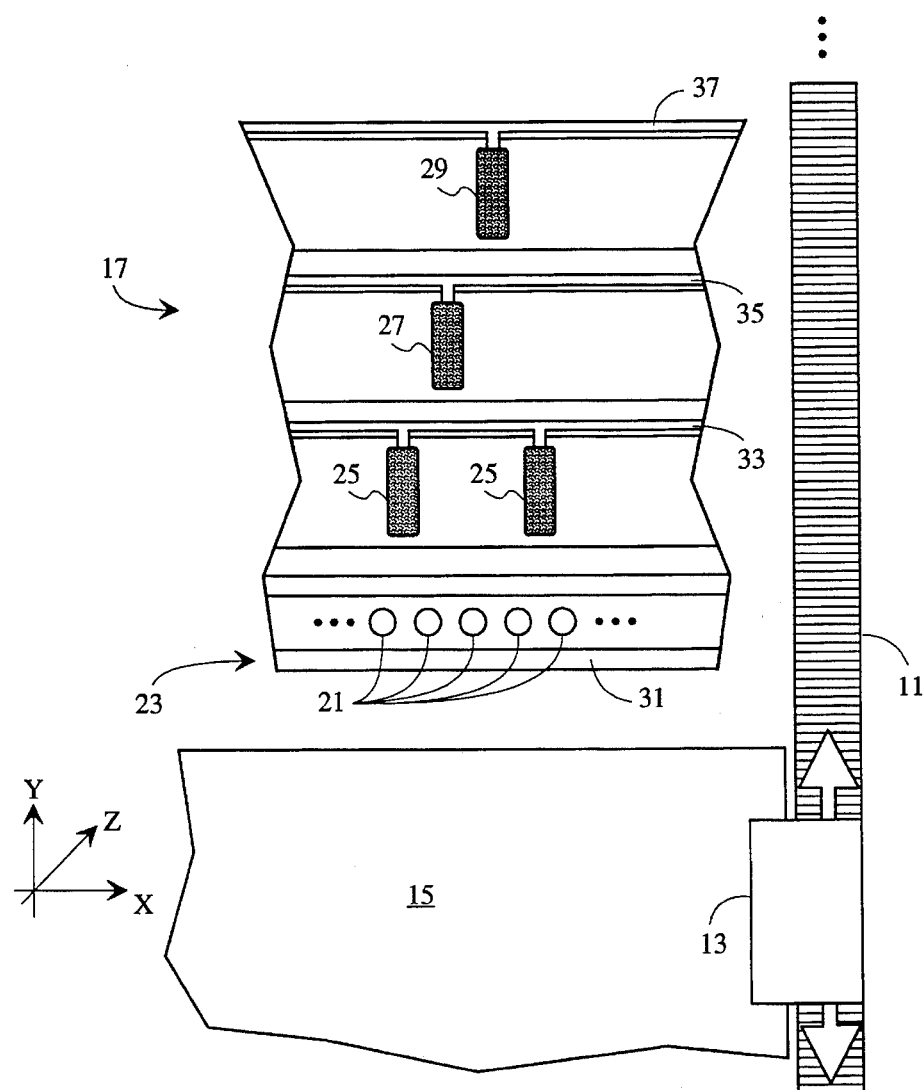
FIG. 1 is a top view of a meniscus coating apparatus for display screens according to the present invention.

As seen in FIG. 1 a movable track 11 having a clamping system 13 attached thereto is provided for fixing a CRT faceplate 15 in a predetermined position for the movement of the CRT faceplate (illustrated as being flat and skirtless), above a meniscus coating assembly 17. The coating assembly 17 comprises at least one meniscus outlet tubule for each screen element to be printed as a line in the screen. That is, there are black matrix, or grille, tubules 21 arrayed in line in the first or upstream position 23. Red tubules 25, green tubules 27 and blue tubules 29 are each arrayed in separate lines and arranged in subsequent alternating sequences to provide the necessary phosphor stripes known in the art to compose a color CRT screen. It is contemplated that the grille may also be laid down prior to the phosphors by more conventional means. As all tubules remain fixed in a predetermined spatial relation to one another, there is a great repeatability of screen production.

Reference may be had to U.S. Pat. No. 4,370,356 to Bok et al. and U.S. Pat. No. 4,004,045 to Stelter for background technical disclosure in unrelated arts of thin film coating using meniscus producing apparatuses.

Figure 2:
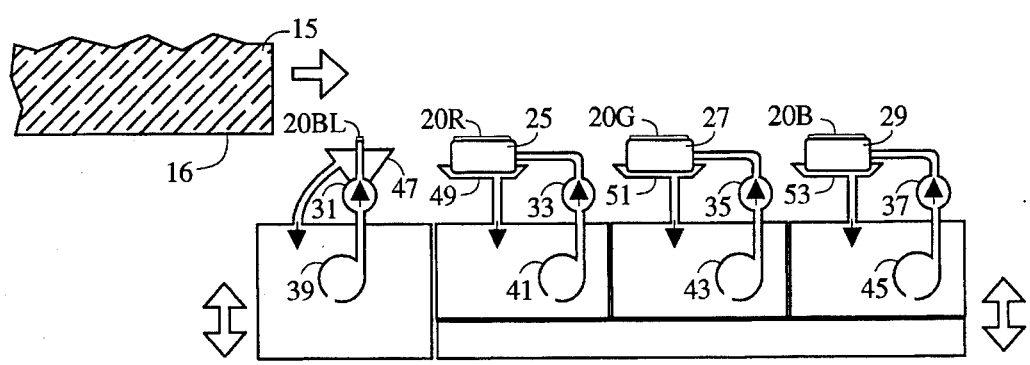
FIG. 2 is a side view of the apparatus of FIG. 1.
Figure 6A:
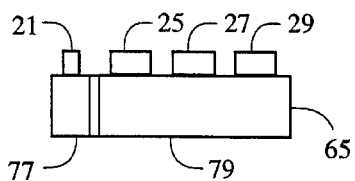
FIG. 6*a–e* illustrates a sequencing of the apparatus usable for skirted faceplates.
Figure 6B:
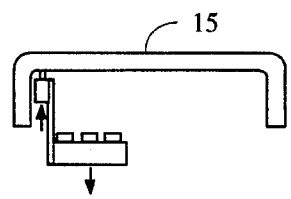
Figure 6C:
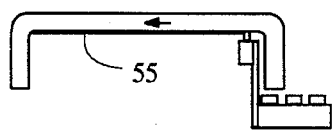
Figure 6D:
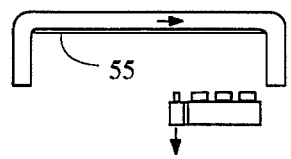
Figure 6E:
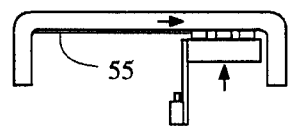

As seen in FIG. 2, solutions or suspensions of screen elements are pumped through the tubules 19 creating menisci 20BL, 20R, 20B, 20G of screen element liquids atop the tubules. The screening surface 16 of the faceplate 15 is brought into contact with the menisci by the track 11 and the linear motion of the faceplate 15 produces relative motion between the faceplate 15 and tubules 21, 25, 27, 29 to create lines of the screen elements. Because the faceplate 15 contacts only the menisci 20BL, 20R, 20G, 20B, variations of faceplate flatness or distance between the faceplate and the tubules may be approximately ten mils. Because the screening surface faces downwardly, airborne particulate contamination of the screen is minimized.

Again referencing FIG. 2, tubules 21, 25, 27, 29 deliver certain constituent screen element liquids, i.e., either black matrix or one of the three phosphor materials, and are attached to separate screen element manifolds 31, 33, 35, 37 respectively, which in turn are attached to pumps 39, 41, 43, 45, respectively, for the delivery of the screen constituent materials to the tubules. Surrounding the tubules 21, 25, 27, 29 are recovery channels 47, 49, 51, 53, respectively, for the capture of the screen element liquids not deposited by meniscus contact between the tubules and faceplate 15 during screen production. The tubules are, of course, arranged co-planar to the screening surface of the faceplate. As seen in FIG. 3 a redundant tubule array 18 may be provided to ensure complete screen element coverage and adequate thickness on the faceplate 15.

Tubules may be of the upright capillary variety such as the grille tubules 21 which may deliver a manganese carbonate solution. The tubules may also be of the porous tubule variety as described in the above-referenced Bok et al. patent. Pore size should be at least twenty microns to accommodate phosphor particles of up to fifteen microns.

Alternatively, as seen in FIG. 5, a weir-type meniscus producing surface 67 may be configured with an edge 69 over which a screen element liquid is flowed by use of a pump 71 connected to a delivery channel 73 on one side of the sharp edge 69. A recovery channel 75 is located on the opposite side of the sharp edge 69 from the delivery channel for recovery of unused liquid.

The overall dimensions of the tubules will be dictated by the dimensions of the line elements needed for screen production. The length of a porous tubule may be extended as necessary to provide an adequate meniscus producing surface for complete deposition of a phosphor line with no voids on the screening surface.

Referencing FIG. 4, the grille tubules are spaced so as to define with their menisci application 55 a transparent window 57 on the faceplate 15 over which the application of the light emissive phosphors 59, 61, 63 occurs by subsequent contact with the meniscus of the phosphor tubules. Overlap of the tubule meniscus areas results in complete phosphor coverage of the windows 57. The grille tubules are located forward by sufficient distance so as to let the grille material dry before the menisci of the phosphor tubules 59, 61, 63 touch the grille material 55 or each other. Because the screening surface of the faceplate 15 is facing down towards the ground, gravity helps the phosphor stripes assume a desirable drop shape with a protuberant surface profile which aids in preventing cross-contamination.

The meniscus printing assembly 17 shown is most ideally arranged to print flat CRT faceplates with no skirt or mask supports attached thereto so as to interfere between the screening surface 16 of the faceplate 15 and the meniscus tubule assembly 17.

As seen in FIG. 6, it is envisioned that a baseplate 65 used to support the tubules may have a first portion 67, holding the black matrix tubules 21, movably interconnected with a second portion 79 of the baseplate holding the in-line arranged phosphor printing tubules 25,27, 29, such that the grille tubules may be contacted with the screening surface at the edge of the skirt, as at position (a), and the entire grille 55 may be laid down by moving the faceplate 15 in one direction, as in position (b), before the grille tubules are lowered, as in position (c). Then faceplate assembly direction is simply reversed while being brought into contact with only the phosphor printing tubules, as in position (d). In this design the faceplate can be screened with or without skirts or mask supports attached.

Figure 7:
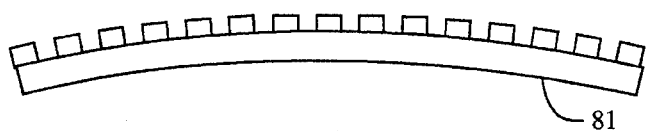
FIG. 7 illustrates a meniscus coating apparatus for cylindrical screens.

As seen in FIG. 7, a cylindrical faceplate such as used by some CRT manufacturers can also easily utilize the invention by having the tubules supported on a radiused or arcuate substrate 81 curved in the same curvature as that of the screening surface of the cylindrical faceplate.

Figure 8:
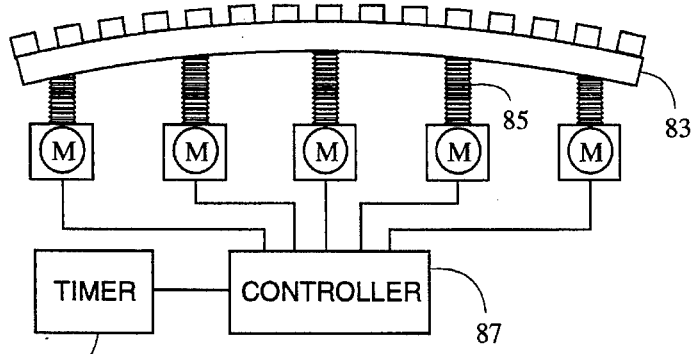
FIG. 8 illustrates a meniscus coating apparatus for spherical screens.

As seen in FIG. 8, if one wants to print spherical faceplates, the tubules can be mounted on a flexible substrate 83 which is activated by actuator rods 85 or the like to adjust the curvature of the substrate 83 in relation to that particular point on the axis of travel of the faceplate, which is being presented to the tubules at that instant. A numerical controller 87 and suitable sensing or timing apparatus 89 would be of course needed. Alternatively it is envisioned that one or more of the meniscus producing surfaces may be mounted on variably positionable armatures which follow the screen curvature to adjust the shape of the arcuate array.

While the present invention has been illustrated and described in connection with the preferred embodiments, it is not to be limited to the particular structure shown, because many variations thereof will be evident to one skilled in the art and are intended to be encompassed in the present invention as set forth in the following claims:

What is claimed is:

1. A device for producing a color video display screen having lines of screen elements comprising:

(a) a meniscus coater having a plurality of meniscus producing surfaces, (b)(1) each said meniscusproducing surface being constructed to provide a meniscus of a screen element liquid having a width sized to produce a meniscus application on the display screen equal to or slightly greater than a desired screen element line width on the display screen, and (b)(2) said meniscus producing surfaces being arranged in at least one array of the desired order, spacing, and sequence to replicate the desired pattern of screen element lines of the display screen.

2. The device of claim 1 further comprising:

means for causing relative motion between a video display screen surface and the meniscus coater during screen production.

3. The device of claim 1 further comprising:

means for delivering a continuous flow of the screen element liquid to said meniscus producing surfaces during screen production.

4. The device of claim 1 wherein at least some of said meniscus producing surfaces are capillary tubules.

5. The device of claim 1 wherein at least some of said meniscus producing surfaces are porous tubules.

6. The device of claim 1 wherein at least some of said meniscus producing surfaces are weir surfaces.

7. The device of claim 1 wherein at least some of said meniscus producing surfaces are constructed and arranged to provide a phosphor screen element meniscus.

8. The device of claim 7 wherein at least some of said meniscus producing surfaces are constructed and arranged to provide a black matrix screen element meniscus.

9. The device of claim 7 wherein there are 1st, 2nd and 3rd type phosphor screen element menisci producing surfaces, each type being arranged in a substantially in-line array and each of said 1st, 2nd and 3rd arrays spaced apart from each other.

10. The device of claim 8 wherein the black matrix meniscus producing surfaces are arranged in a first substantially in-line array and spaced apart from a second substantially in-line array of phosphor meniscus producing surfaces.

11. The device of claim 10 further comprising means for causing a selected one of the array of black matrix meniscus producing surfaces or the array of phosphor meniscus producing surfaces to be in a position whereby only the selected one array is operable to produce a screen element line of the display screen.

12. The device of claim 1 wherein said meniscus producing surfaces are surrounded by channels for recovery of the screen element liquid.

13. The device of claim 1 wherein said meniscus producing surfaces are arranged in an arcuate array.

14. The device of claim 13 further comprising means for changing the shape of the arcuate array.

15. A method for producing a color video display screen having lines of screen elements comprising:

(a) arranging a plurality of meniscus producing surfaces in the desired order, spacing, and sequence to replicate a desired pattern of screen element lines of the video display screen, (b) flowing a first screen element liquid over a predetermined first plurality of said meniscus producing surfaces to create a first plurality of menisci of the first screen element liquid, (c) flowing a second screen element liquid over a predetermined second plurality of said meniscus producing surfaces to create a second plurality of menisci of the second screen element liquid, (d) contacting a display screen surface with the first and second plurality of menisci, and causing relative motion between the first and second plurality of menisci and the screen surface, thereby coating the screen surface with a plurality of lines of screen element liquid necessary to producing the desired display screen.

16. A device for producing a color video display screen having lines of screen elements comprising:

(a) a meniscus coater having a plurality of meniscus producing surfaces greater than or equal to the number of screen element lines desired to be printed on the screen;

(b)(1) each said meniscus producing surface being constructed to provide a meniscus width of a screen element liquid sized to produce a meniscus application on the screen equal to or greater than a desired screen element line width on the screen, and (b)(2) said meniscus producing surfaces being arranged in at least one array of the desired order, spacing, and sequence to replicate the desired pattern of screen element lines of the screen;

(c) reservoirs for storing each type of screen element liquid;

(d) pumps connected to said reservoirs for delivering the screen element liquids to said meniscus producing surfaces.

* * * * *